United States Patent
Ikedo et al.

(10) Patent No.: US 7,456,034 B2
(45) Date of Patent: Nov. 25, 2008

(54) NITRIDE SEMICONDUCTOR DEVICE AND METHOD FOR FABRICATING THE SAME

(75) Inventors: Norio Ikedo, Osaka (JP); Yasuyuki Fukushima, Osaka (JP); Masaaki Yuri, Osaka (JP)

(73) Assignee: Panasonic Corporation, Osaka (JP)

( * ) Notice: Subject to any disclaimer, the term of this patent is extended or adjusted under 35 U.S.C. 154(b) by 129 days.

(21) Appl. No.: 11/437,642

(22) Filed: May 22, 2006

(65) Prior Publication Data

US 2006/0268953 A1 Nov. 30, 2006

(30) Foreign Application Priority Data

May 25, 2005 (JP) ............................. 2005-152602

(51) Int. Cl.
*H01L 21/00* (2006.01)

(52) U.S. Cl. ........................ 438/22; 438/46; 438/107; 438/503; 257/E21.093; 257/E21.366

(58) Field of Classification Search ................. 438/503; 257/E21.093, E21.116, E21.365, E21.366
See application file for complete search history.

(56) References Cited

U.S. PATENT DOCUMENTS

2002/0179923 A1* 12/2002 Morita et al. ................ 257/103

FOREIGN PATENT DOCUMENTS

| JP | 10-012922 | 1/1998 |
|----|-----------|--------|
| JP | 10-135514 | 5/1998 |
| JP | 2002-043618 | 2/2002 |
| JP | 3304787 | 5/2002 |

* cited by examiner

*Primary Examiner*—Walter L Lindsay, Jr.
*Assistant Examiner*—Cheung Lee
(74) *Attorney, Agent, or Firm*—McDermott Will & Emery LLP

(57) ABSTRACT

A nitride semiconductor device comprises: a well layer of nitride semiconductor containing In and Ga; barrier layers of nitride semiconductor sandwiching the well layer, containing Al and Ga, and having a larger band gap energy than the well layer; and a thin film layer provided between the well layer and the barrier layer. The thin film layer is formed during lowering of the substrate temperature after formation of the barrier layer or during elevation of the substrate temperature after formation of the well layer.

8 Claims, 11 Drawing Sheets

FIG. 3

STEP1: Substrate 1 of sapphire having been adequately cleaned is inserted into reaction tube, and with nitrogen and hydrogen flowed into reaction tube, substrate 1 is heated at about 1100°C for ten minutes to clean surface of substrate 1.

STEP2: Temperature of substrate 1 is lowered to about 570°C, and nitrogen, TMG, and ammonia are flowed to form buffer layer 2 of GaN on substrate 1.

STEP3: While TMG supply is stopped and nitrogen and ammonia are flowed, temperature of substrate 1 is elevated to about 1150°C. Under this temperature, nitrogen, hydrogen, TMG, and ammonia are flowed to grow underlying layer 3 of GaN.

STEP4: MG supply is stopped and temperature of substrate 1 is lowered to 1100°C. Nitrogen, hydrogen, TMG, TMA, and ammonia are flowed to grow the 10 nm-thick barrier layer 4 of $Al_{0.15}Ga_{0.85}N$.

STEP5: Supply of TMG, TMA, and hydrogen is stopped, and temperature of substrate 1 is lowered to about 900°C. Nitrogen, TMG, TMA, TMI, and ammonia are flowed to grow the 2 nm-thick well layer 5 of $Al_{0.02}In_{0.02}Ga_{0.96}N$. Then, while supply of TMA and TMI is stopped and thin film layer 6 of GaN is grown with nitrogen, TMG, and ammonia flowed, temperature of substrate 1 is elevated from 900 to 1100°C.

STEP6: With temperature of substrate 1 kept at 1100°C, nitrogen, hydrogen, TMG, TMA, and ammonia are flowed to grow barrier layer 7 of $Al_{0.15}Ga_{0.85}N$. Then, supply of TMG, TMA, and hydrogen is stopped and temperature of substrate 1 is lowered to 900°C.

STEP7: Well layer 8, thin film layer 9, barrier layer 10 are sequentially stacked in the same procedure as formation of well layer 5, thin film layer 6, and barrier layer 7, thereby fabricating MQW. By supplying TMG during temperature elevation, thicknesses of thin film layers 6, 9, and 12 made of GaN are controlled within the range of 0 to 4 nm.

NITRIDE SEMICONDUCTOR DEVICE AND METHOD FOR FABRICATING THE SAME

BACKGROUND OF THE INVENTION (a) Fields of the Invention

The present invention relates to nitride semiconductor structures which are employed for optical devices and the like such as light emitting diodes and semiconductor laser diodes, and to fabrication methods of such structures.

(b) Description of Related Art

Compounds expected to be applied to visible light emitting devices, high-temperature operable electronic devices, or the like include nitride semiconductors indicated by AlGaInN and containing Al, Ga, In or the like as a group III element and N as a group V element. Semiconductor devices employing AlGaInN are being put to practical use in the field of a blue or green light emitting diode and a blue-violet laser diode.

In fabricating a light emitting element using this nitride semiconductor, growing a crystal of a nitride semiconductor thin film by a metal-organic chemical vapor deposition (MOCVD) method is the mainstream. This technique is carried out in the following manner. A reaction tube with a substrate of, for example, sapphire, SiC, GaN, or Si placed therewithin is supplied with trimethyl gallium (abbreviated hereinafter as "TMG"), trimethyl aluminum (abbreviated hereinafter as "TMA"), trimethyl indium (abbreviated hereinafter as "TMI") or the like as a group III material gas, and also supplied with ammonia, hydrazine, or the like as a group V material gas. While the temperature of the substrate is kept at a high temperature of about 600 to 1200° C., an n-type layer, a light emitting layer, and a p-type layer are grown on the substrate to stack nitride semiconductor layers. The growth of the n-type layer is conducted while monosilane ($SiH_4$) or the like as an n-type impurity material gas is flowed with a group III material gas, and the growth of the p-type layer is conducted while cyclopentadienyl magnesium ($Cp_2Mg$) or the like as a p-type impurity material gas is flowed with a group III material gas.

After this growth step, the surfaces of the n-type layer and the p-type layer are formed with an n-type electrode and a p-type electrode, respectively, and the resulting substrate is separated in chip shapes to fabricate light emitting elements.

As the material for the light emitting layer, use is made of InGaN in which In composition is adjusted to have a desired light-emission wavelength. This light emitting layer is sandwiched by cladding layers with a larger band gap energy than the light emitting layer to construct a double heterostructure, or this light emitting layer is made of a thin film layer capable of producing a quantum size effect to construct a quantum well structure. These two structures have been studied actively in recent years.

The quantum well structure is constructed in the manner in which a layer with a smaller band gap energy (a well layer) is sandwiched by barrier layers with a large band gap energy. In the case of using the quantum well structure for an active layer, use is made of a single quantum well structure (SQW) having one well layer or a multiple quantum well structure (MQW) in which the well layer and the barrier layer are alternately formed. Of the two structures, the MQW is conventionally fabricated by any one of three related arts that will be shown below.

A first related art is the method disclosed in Japanese Unexamined Patent Publication No. H10-12922. In this method, using an MOCVD apparatus, a MQW structure is constructed by repeatedly forming a quantum well structure composed of InGaN as a well layer and AlGaN as a barrier layer.

A second related art is the method disclosed in Japanese Patent No. 3304787. In this method, adjustment of thicknesses of the barrier layers uniformizes the thicknesses of the barrier layers after the growth of the cladding layer to prevent wavelength shift of emitted light.

A third related art is the method disclosed in Japanese Unexamined Patent Publication No. 2002-43618. This method is characterized in that GaN as part of a barrier layer is formed with the temperature elevated to the growth temperature of the barrier layer, thereby preventing degradation of a well layer.

SUMMARY OF THE INVENTION

The MQW fabrication methods as described in three related arts, however, have the following problems.

In the first related art, since after the growth of the InGaN layer as the well layer, the substrate is heated to the growth temperature of the AlGaN layer (1100° C.) as the barrier layer, the well layer may decompose during the temperature elevation. Thus, it is difficult to form a well layer with an excellent crystallinity.

In the second related art, after the growth of the InGaN layer as the well layer, the substrate is heated to the growth temperature of GaN (900° C.) as the barrier layer. During this process, the well layer decomposes, which makes it difficult to form a well layer with a high quality.

In the third related art, after the growth of the barrier layer (the GaN layer), TMG supply is stopped while the substrate temperature is lowered from the growth temperature of the barrier layer to the growth temperature of the well layer to be formed subsequently. Thereby, decomposition of the barrier layer may occur, which makes it difficult to maintain the barrier layer with a high quality. This in turn affects the subsequent growth of the well layer on this barrier layer to make it difficult to form a high quality well layer with an excellent surface flatness. In addition, if the barrier layer is made of a ternary or higher-order mixed crystal such as AlGaN or AlInGaN, composition of the barrier layer growing during the temperature elevation alters to make it difficult to form a barrier layer with high quality. On the other hand, if the well layer is made of a ternary or lower-order mixed crystal such as GaN or InGaN and the barrier layer is made of a ternary or lower-order mixed crystal such as GaN or AlGaN, strain created at the interface between the well layer and the barrier layer generates internal electric field within the well layer to disadvantageously decrease the light emission efficiency.

An object of the present invention is to provide a MQW structure with a hetero interface in which the crystallinity of a barrier layer is improved and concurrently degradation of a well layer is suppressed, and to provide a fabrication method of such a structure.

A nitride semiconductor device of the present invention comprises a substrate; a well layer of nitride semiconductor provided above the substrate and containing In and Ga; a plurality of barrier layers of nitride semiconductor provided above the substrate so that they sandwich the well layer to construct a quantum well, containing Al and Ga, and having larger band gap energies than the well layer; and a thin film layer of nitride semiconductor which is provided at least at either a position located on one of the plurality of barrier layers and under the well layer or a position located on the well layer and under another one of the plurality of barrier layers, and which has a band gap energy larger than that of the well layer and smaller than those of the barrier layers.

In particular, when the thin film layer is provided at a position located on one of the plurality of barrier layers and under the well layer, removal of nitrogen from the barrier layer during a formation process can be prevented to avoid degradation of the quality of the barrier layer. Moreover, strain created between the barrier layer and the well layer can also be reduced, so that generation of internal electric field can be suppressed to enhance the light emission efficiency.

With this device, when the thin film layer is provided at a position located on the well layer and under another one of the plurality of barrier layers, removal of nitrogen, In, and the like from the well layer during a formation process can be prevented to avoid degradation of the quality of the well layer. Moreover, strain created between the barrier layer and the well layer can also be reduced to enhance the light emission efficiency.

With this device, when the thin film layer is provided at both of a position located on one of the plurality of barrier layers and under the well layer and a position located on the well layer and under another one of the plurality of barrier layers, degradation of the qualities of the well layer and the barrier layer can be avoided to further enhance the light emission efficiency.

A first method for fabricating a nitride semiconductor device according to the present invention is designed for a nitride semiconductor device which includes a well layer provided above a substrate, a plurality of barrier layers sandwiching the well layer to construct a quantum well, and a first thin film layer provided on one of the plurality of barrier layers and under the well layer. This method comprises: the step (a) of depositing nitride semiconductor containing Al and Ga above the substrate at a substrate temperature T1, thereby forming one of the plurality of barrier layers; the step (b) of depositing, on one said barrier layer, nitride semiconductor having a smaller band gap energy than one said barrier layer, thereby forming the first thin film layer; the step (c) of depositing nitride semiconductor on the first thin film layer at a substrate temperature T2 (where T1>T2) to form the well layer, the nitride semiconductor containing In and Ga and having a smaller band gap energy than the first thin film layer; and the step (d) of depositing nitride semiconductor on or above the well layer at a substrate temperature T3 (where T3>T2) to form another one of the plurality of barrier layers, the nitride semiconductor containing Al and Ga and having a larger band gap energy than the first thin film layer and the well layer.

Thus, by forming the first thin film layer on the barrier layer before formation of the well layer, removal of nitrogen and the like from the barrier layer can be prevented in lowering the substrate temperature to the growth temperature of the well layer. Furthermore, the first thin film layer relaxes strain created between the barrier layer and the well layer, whereby generation of internal electric field can be suppressed to enhance the light emission efficiency.

This method further comprises, after the step (c) and before the step (d), the step (e) of depositing nitride semiconductor on the well layer to form the second thin film layer, the nitride semiconductor having a band gap energy larger than that of the well layer and smaller than those of the plurality of barrier layers. This prevents removal of nitrogen and the like from the well layer during elevation of the substrate temperature from T2 to T3.

A second method for fabricating a nitride semiconductor device according to the present invention is designed for a nitride semiconductor device which includes a well layer provided above a substrate, a plurality of barrier layers sandwiching the well layer to construct a quantum well, and a thin film layer provided on the well layer and under one of the plurality of barrier layers. This method comprises: the step (a) of depositing nitride semiconductor containing Al and Ga above the substrate at a substrate temperature T1, thereby forming one of the plurality of barrier layers; the step (b) of depositing nitride semiconductor on or above one said barrier layer at a substrate temperature T2 (where T1>T2) to form the well layer, the nitride semiconductor containing In and Ga and having a smaller band gap energy than one said barrier layer; the step (c) of depositing nitride semiconductor on the well layer to form the thin film layer, the nitride semiconductor having a band gap energy larger than that of the well layer and smaller than those of the plurality of barrier layers; and the step (d) of depositing nitride semiconductor on the thin film layer at a substrate temperature T3 (where T3>T2) to form another one of the plurality of barrier layers, the nitride semiconductor containing Al and Ga and having a larger band gap energy than the thin film layer and the well layer.

This method prevents removal of nitrogen and the like from the well layer and relaxes strain placed to the upper surface side of the well layer, which enables improvement of the light emission efficiency.

BRIEF DESCRIPTION OF THE DRAWINGS

FIG. 3 is a flow chart showing fabrication steps of the MQW according to the first embodiment.

DETAILED DESCRIPTION OF THE PREFERRED EMBODIMENTS

First Embodiment

Figure 1:
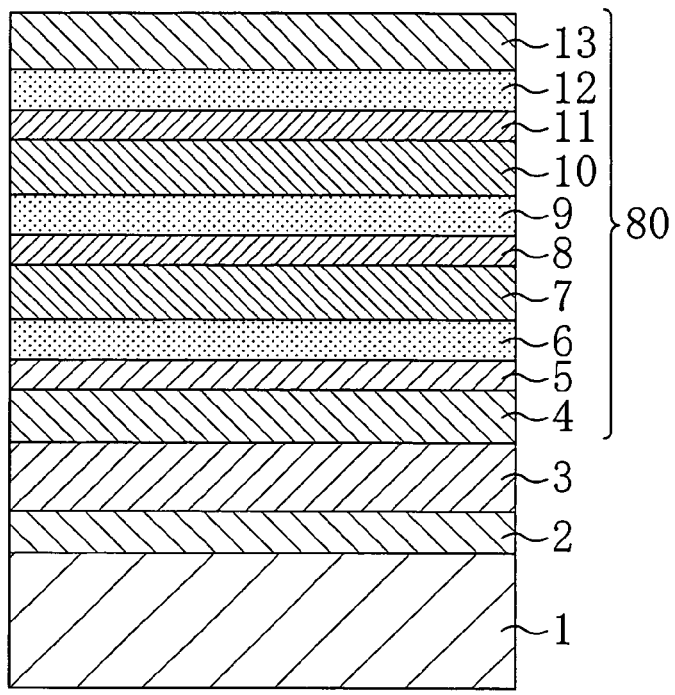
FIG. 1 is a sectional view showing a nitride semiconductor device with a MQW according to a first embodiment of the present invention.

FIG. 1 is a sectional view showing a nitride semiconductor device with a MQW according to a first embodiment of the present invention. FIG. 1 particularly illustrates a portion of the MQW.

Referring to FIG. 1, the nitride semiconductor device of the first embodiment includes: a substrate 1 of sapphire; a buffer layer 2 of GaN provided on the substrate 1; an underlying layer 3 of GaN provided on the buffer layer 2; and a MQW 80 of nitride semiconductor provided on the underlying layer 3. The MQW 80 has a structure in which a barrier layer of $Al_{0.15}Ga_{0.85}N$, a well layer of $Al_{0.02}In_{0.02}Ga_{0.96}N$ provided on the barrier layer, and a thin film layer of GaN provided on the well layer are repeatedly stacked in this order. In the example shown in FIG. 1, on the underlying layer 3, a barrier layer 4, a well layer 5, a thin film layer 6, a barrier layer 7, a well layer 8, a thin film layer 9, a barrier layer 10, a well layer 11, a thin film layer 12, and a barrier layer 13 are sequentially provided from bottom to top. In the MQW 80, the lowermost and uppermost layers are the barrier layers for confining carriers in the well layers. The thin film layers 6, 9, and 12 have a thickness of, for example, 4 nm or smaller, more preferably 2 nm or smaller. The buffer layer 2 and the underlying layer 3 have thicknesses of, for example, 0.02 μm and 1 μm, respectively. The well layers 5, 8, and 11 have a thickness of, for example, 2 nm. The barrier layers 4, 7, 10, and 13 have a thickness of, for example, 10 nm.

In the nitride semiconductor device of the first embodiment, the magnitudes of the band gap energies of the barrier layer, the thin film layer, and the well layer satisfy the barrier layer>the thin film layer>the well layer. In particular, the thin film layers 6, 9, and 12 have larger band gaps than the well layers 5, 8, and 11 and thicknesses of 2 nm or smaller. Thereby, when the MQW 80 is employed for a light emitting element such as an LED (Light Emitting Diode) or a laser, carriers can be confined well within the well layers 5, 8, and 11.

A characteristic of the MQW of the first embodiment is that the thin film layer of nitride semiconductor is provided on the well layer of nitride semiconductor containing In and Ga and under the barrier layer.

The nitride semiconductor device with the MQW in the first embodiment is fabricated by the following procedure using an MOCVD method.

Figure 2:
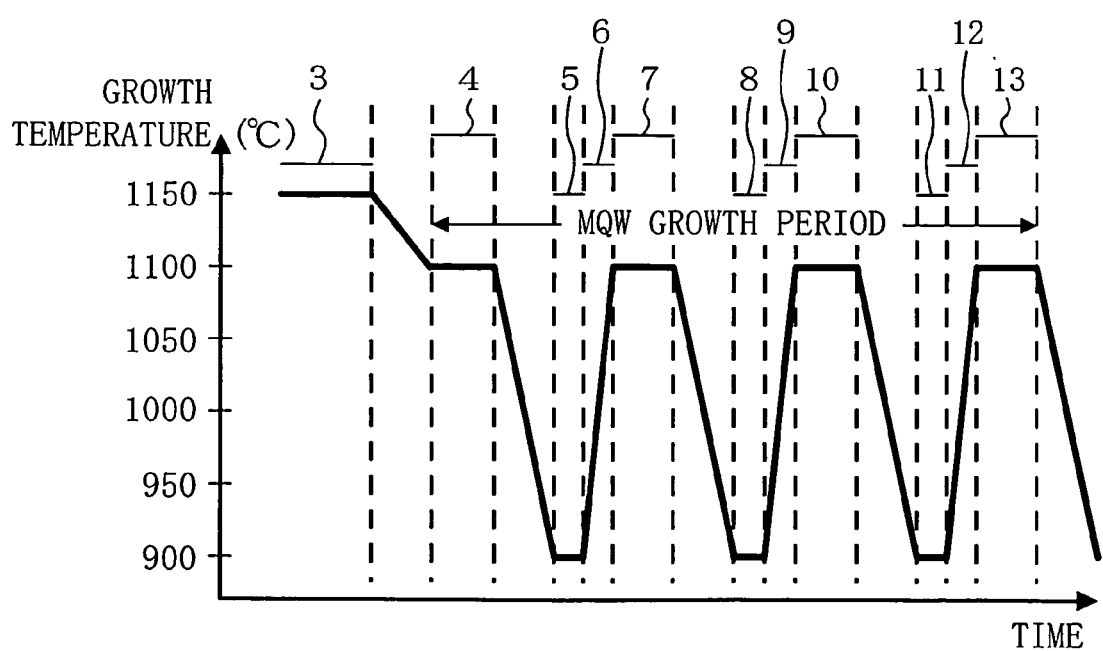
FIG. 2 is a graph showing a profile of the temperature for growing nitride semiconductor layers constituting the MQW according to the first embodiment.

FIG. 2 is a graph showing a profile of the temperature for growing the nitride semiconductor layers constituting the MQW according to the first embodiment. FIG. 3 is a flow chart showing fabrication steps of the MQW according to the first embodiment. Note that the fabrication condition for the MQW of the first embodiment which will be described below is just one example, and temperature, pressure, and other conditions are not limited to this example.

First, in the step 1 shown in the FIG. 3, the substrate 1 of sapphire having been adequately cleaned is inserted into a reaction tube of an MOCVD apparatus, and then with nitrogen and hydrogen flowed into the reaction tube, the substrate 1 is heated at about 1100° C. for ten minutes to clean the surface of the substrate 1. During this cleaning, the pressure within the reaction tube is set at 1013 hPa, the nitrogen flow rate is set at 7010 mL/min (=7010 sccm), and the hydrogen gas flow rate is set at 3000 mL/min.

Next, in the step 2, the temperature of the substrate 1 is lowered to about 570° C., and nitrogen, TMG, and ammonia are flowed into the reaction tube to form the buffer layer 2 of GaN on the substrate 1. During this formation, the pressure within the reaction tube is set at 1013 hPa. The flow rates of nitrogen, TMG, and ammonia are set at 15500 mL/min, 8 mL/min (=35.1 μmol/min), and 5000 mL/min, respectively.

In the step 3, while TMG supply is stopped and nitrogen and ammonia are flowed, the temperature of the substrate 1 is elevated to about 1150° C. Under this temperature, nitrogen, hydrogen, TMG, and ammonia are flowed into the reaction tube to grow the underlying layer 3 of GaN on the buffer layer 2. During this growth, the pressure within the reaction tube is set at 1013 hPa. The flow rates of nitrogen, hydrogen, TMG, and ammonia are set at 6680 mL/min, 2080 mL/min, 19.8 mL/min (=86.8 μmol/min), and 1250 mL/min, respectively.

Subsequently, in the step 4, TMG supply is stopped, and then the temperature of the substrate 1 is lowered to about 1100° C. Under this temperature, nitrogen, hydrogen, TMG, TMA, and ammonia are flowed into the reaction tube to grow the 10 nm-thick barrier layer 4 of $Al_{0.15}Ga_{0.85}N$. During this growth, the pressure within the reaction tube is set at 1013 hPa. The flow rates of nitrogen, hydrogen, TMG, TMA, and ammonia are set at 22900 mL/min, 2708 mL/min, 3.97 mL/min (=17.4 μmol/min), 3.56 mL/min (=3.30 μmol/min), and 2500 mL/min, respectively.

In the step 5, supply of TMG, TMA, and hydrogen is stopped, and then the temperature of the substrate 1 is lowered to about 900° C. With the temperature of the substrate 1 at 900° C., nitrogen, TMG, TMA, TMI, and ammonia are flowed into the reaction tube to grow the 2 nm-thick well layer 5 of $Al_{0.02}In_{0.02}Ga_{0.96}N$. During this growth, the pressure within the reaction tube is set at 1013 hPa. The flow rates of nitrogen, hydrogen, TMG, TMA, TMI, and ammonia are set at 2494 mL/min, 6 mL/min, 1.78 mL/min (=7.80 μmol/min), 0.38 mL/min (=0.353 μmol/min), 97.4 mL/min (=8.88 μmol/min), and 5000 mL/min, respectively.

Then, supply of TMA and TMI is stopped, and the temperature of the substrate 1 is elevated from 900 to 1100° C. with nitrogen, TMG, and ammonia flowed thereon. In this manner, the thin film layer 6 of GaN is grown during elevation of temperature of the substrate 1 (the latter half of the step 5 shown in FIG. 3). Note that the time required to elevate the temperature of the substrate 1 is set at about 2.5 minutes.

In the step 6, with the temperature of the substrate 1 kept at 1100° C., nitrogen, hydrogen, TMG, TMA, and ammonia are flowed into the reaction tube to grow the barrier layer 7 of $Al_{0.05}Ga_{0.85}N$. During this growth, the pressure within the reaction tube is set at 1013 hPa. The flow rates of nitrogen, hydrogen, TMG, TMA, and ammonia are set at 22900 mL/min, 2708 mL/min, 3.97 mL/min (=17.4 μmol/min), 3.56 mL/min (=3.30 μmol/min), and 2500 mL/min. Then, supply of TMG, TMA, and hydrogen is stopped and the temperature of the substrate 1 is lowered to 900° C. This lowering is done for about seven minutes.

Thereafter, in the step 7, the well layer 8, the thin film layer 9, the barrier layer 10, and other layers are sequentially stacked in the same procedure as formation of the well layer 5, the thin film layer 6, and the barrier layer 7. The MQW is thus fabricated. By adjusting the amount of TMG supplied during elevation of temperature of the substrate 1, the thicknesses of the thin film layers 6, 9, and 12 made of GaN are controlled within the range of more than 0 nm and no more than 4 nm.

In the MQW fabricated in the manner described above, the relation between the thickness of the thin film layer and the performance of the MQW will be now described with the result of testing.

Figure 12:
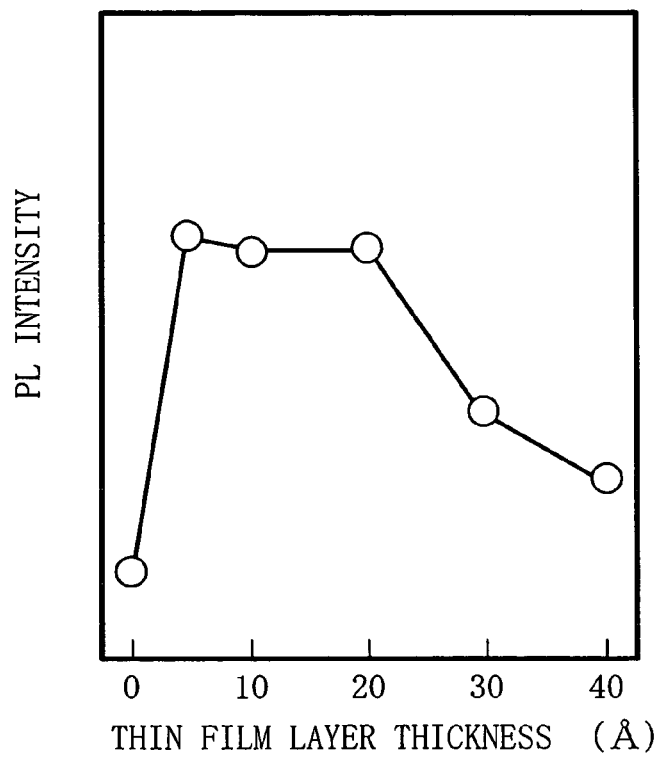
FIG. 12 is a graph showing the relation between the thickness of a thin film layer and the light emission intensity (photoluminescence (PL) intensity) in the MQW according to the first embodiment.

FIG. 12 is a graph showing the relation between the thickness of the thin film layer and the light emission intensity (photoluminescence (PL) intensity) in the MQW of the first embodiment. In this test, the MQW has the structure in which three quantum wells are stacked. The PL intensity shown in FIG. 12 was observed when the MQW was excited by a HeCd (helium-cadmium) laser with a wavelength of 325 nm. Note that the state in which the thin film layer has a thickness of 0 nm means the case where the conventional MQW was employed in this test.

As can be seen from FIG. 12, the PL intensity of the MQW significantly varied depending on the thickness of the thin film layer, and particularly the PL intensity was maximum when the thin film layer had a thickness of 2 nm (20 angstrom) or smaller. From this result, it is found that in the MQW of the first embodiment, it is particularly preferable to have the thin film layer with a thickness more than 0 nm and no more than 2 nm. However, for all of the measured thicknesses, the PL intensity of the MQW of the first embodiment greatly exceeded the PL intensity of the conventional MQW.

Figure 13:
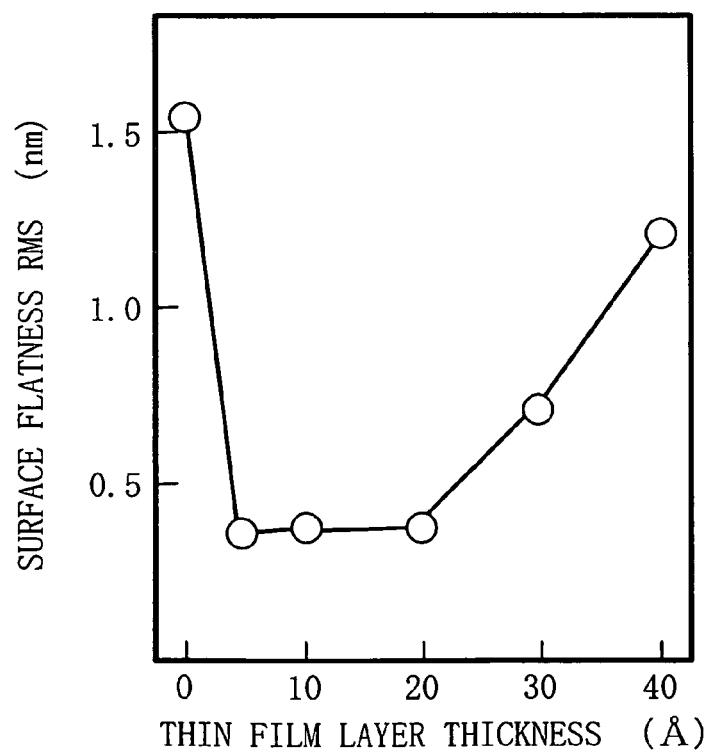
FIG. 13 is a graph showing the relation between the thickness of the thin film layer and the surface flatness in the MQW according to the first embodiment.

FIG. 13 is a graph showing the relation between the thickness of the thin film layer and the surface flatness in the MQW of the first embodiment. Also in this test, as in the case of the test in FIG. 12, the MQW has the structure in which three quantum wells are stacked. FIG. 13 plots in ordinate RMS (Root Mean Square) of the top surface flatness of the MQW measured by an atomic force microscope (AFM).

As can be seen from FIG. 13, the surface flatness of the MQW significantly varied depending on the thickness of the thin film layer. In particular, when the thin film layer had a thickness of 2 nm or smaller, the RMS value of surface flatness of the MQW became smaller. From this result, it is found that also in regard to the surface flatness, it is preferable to have the thin film layer with a thickness of 2 nm or smaller. However, for all of the measured thicknesses, the top surface of the MQW of the first embodiment was flatter than that of the conventional MQW.

The reason why the above results were obtained is considered as follows.

In the case where the well layer contains In, the optimal temperature for crystal growth of the well layer is lower than that of the barrier layer of AlGaN or the like. Because of this, if the barrier layer is formed after formation of the well layer, the substrate temperature should be elevated. However, since supply of the material gas is stopped during elevation of the substrate temperature, nitrogen and In evaporate from the well layer in the conventional MQW to roughen the surface of the well layer and also degrade the light emission efficiency. On the other hand, in the MQW of the first embodiment, the thin film layer is formed during elevation of the substrate temperature after the well layer formation. This prevents removal of nitrogen and the like from the well layer. From this, it is conceivable that the top surface of the MQW in the first embodiment is made flatter than that of the conventional MQW to provide a high PL intensity. Moreover, the change in the composition of the well layer can also be prevented. Furthermore, the formed thin film layer can prevent removal of nitrogen and the like from the well layer even though the well layer and the barrier layer are not formed at the same temperature. This enables formation of the well layer and the barrier layer at their optimal growth temperatures. As a result of this, the qualities of the well layer and the barrier layer can be improved.

In addition, since the thin film layer has a band gap energy larger than that of the well layer and smaller than that of the barrier layer, almost the same level of carriers as the case of forming no thin film layer can be confined within the well layer.

Moreover, with the MQW of the first embodiment, the formed thin film layer can also relax strain created between the well layer and the barrier layer as compared to the conventional MQW. This reduces internal electric field which is generated within the quantum well composed of the well layer, the barrier layer, and the thin film layer, so that spatial overlap between electrons and holes existing in the conductive band and the valence band confined within the well layer increases to enhance the light emission efficiency. Furthermore, relaxation of strain within the MQW improves the controllability of peak wavelength in emitting light by the MQW.

In addition, in the MQW of the first embodiment, the thin film layer is formed during elevation of the substrate temperature. Therefore, no special apparatus is required, and in addition formation thereof is done for the same period of time and at the same cost as the case where no thin film layer is formed.

In the result shown in FIG. 12, the PL intensity is degraded when the thin film layer has a thickness more than 2 nm. The reason for this is conceivably that if the thin film layer is too thick, the thin film layer itself will serves as a barrier confining carriers within the well layer to decrease the probability of existence of carriers within the well layer. In the MQW of the first embodiment, the thin film layer is formed at a temperature range of 900 to 1100° C. However, since such a temperature is lower than the optimal condition for formation of the thin film layer, it is conceivable that also in this regard, the thin film layer is preferably not too thick.

The MQW of the first embodiment can be applied to a semiconductor device such as an LED, a semiconductor laser, or a HEMT (High Electron Mobility Transistor). For an LED, for example, an n-type compound semiconductor layer connected to an n-side electrode is provided below the MQW, while a p-type compound semiconductor layer connected to a p-side electrode is provided above the MQW. By this structure, holes injected from the p-side electrode and electrons injected from the n-side electrode can be recombined in the well layer, so that a high light emission efficiency can be offered. This effect is exerted similarly by embodiments that will henceforth be described. Alternatively, n-type impurities are injected into a barrier layer provided in the lowermost layer of the MQW, while p-type impurities are injected into a barrier layer provided in the uppermost layer of the MQW. Even the device with this structure can function as an LED.

For a HEMT, source and drain electrodes coming into ohmic contact with the barrier layer and a gate electrode coming into Schottky contact with the barrier layer are provided above the barrier layer as the uppermost layer of the MQW. Since the top and bottom surfaces of the well layer functioning as a channel are flat, the HEMT can be fabricated which has a more improved carrier mobility than the conventional one.

In the MQW of the first embodiment, $Al_{0.02}In_{0.02}Ga_{0.96}N$ that is a quaternary crystal is used as the material for the well layer, but the material for the well layer is not limited to this. As long as a mixed crystal containing In and Ga is used as the material for the well layer, the optimal growth temperature thereof is lower than that of a mixed crystal containing Al and Ga. Therefore, the same effects as the MQW of the first embodiment can be exerted. The barrier layer may also be made of a material other than AlGaN. For example, in the case where the thin film layer is made of GaN, even though the well layer is formed of InGaN (a ternary crystal) and the barrier layer is made of AlInGaN (a quaternary crystal), the same effects as the MQW of the first embodiment can be exerted. That is to say, it is sufficient that the well layer is made of $In_xAl_yGa_{1-x-y}N(0<x<1, 0<y<1,$ and $0<x+y<1)$ and the barrier layer is made of $In_wAl_zGa_{1-z-w}N(0\leq w<1, 0<z<1,$ and $0<z+w<1)$. In the MQW of the first embodiment, GaN is used as the material for the thin film layer. Instead of this, use may be made of the material having an energy band gap larger than that of the well layer and smaller than that of the barrier layer.

Even if the barrier layer is undoped or n-doped, the MQW can exert the same effects. The example shown in FIG. 1 uses a sapphire substrate as the substrate 1, but use of another substrate such as a SiC substrate, a ZnO substrate, a GaN substrate, or a Si substrate can also provide the same effects as the MQW of the first embodiment.

Second Embodiment

Figure 4:
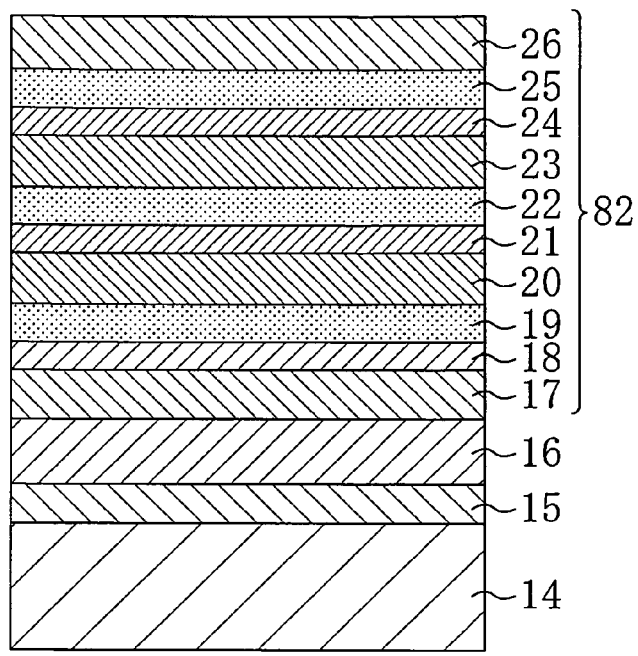
FIG. 4 is a sectional view showing a nitride semiconductor device with a MQW according to a second embodiment of the present invention.
Figure 5:
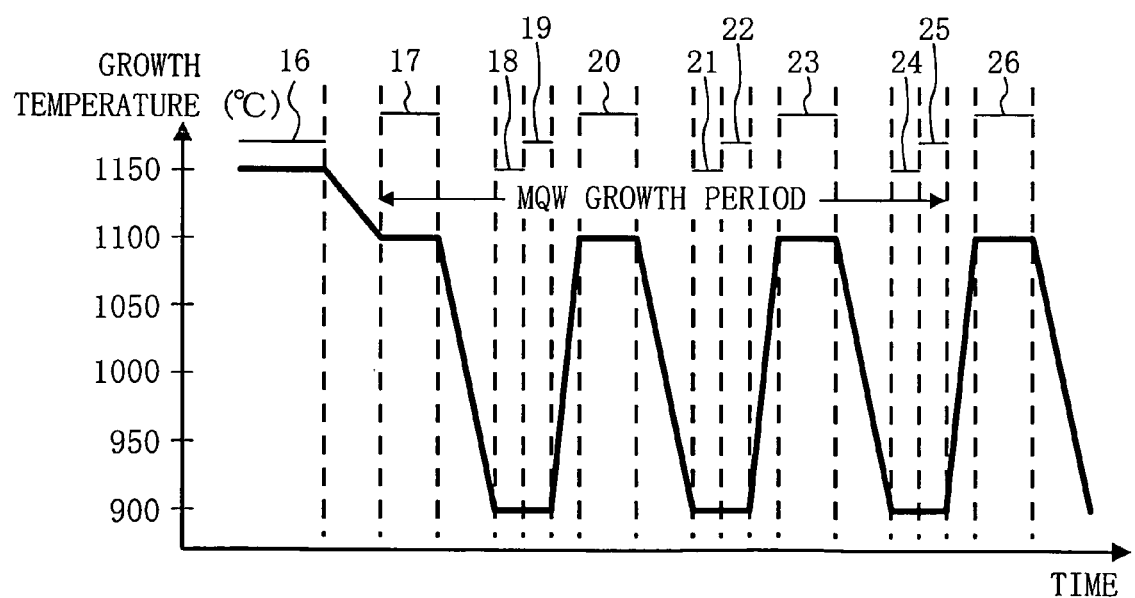
FIG. 5 is a graph showing a profile of the temperature for growing nitride semiconductor layers constituting the MQW according to the second embodiment.

FIG. 4 is a sectional view showing a nitride semiconductor device with a MQW according to a second embodiment of the present invention. FIG. 5 is a graph showing a profile of the temperature for growing nitride semiconductor layers constituting the MQW according to the second embodiment.

The nitride semiconductor device of the second embodiment has the same structure as that of the nitride semiconductor device of the first embodiment. However, in order to make a distinction to the nitride semiconductor device of the first embodiment, different reference numerals from those used in FIG. 1 are retained to nitride semiconductor layers shown in FIG. 4. Specifically, the nitride semiconductor device of the second embodiment includes, from bottom to top, a substrate 14, a buffer layer 15, an underlying layer 16, a barrier layer 17, a well layer 18, a thin film layer 19, a barrier layer 20, a well layer 21, a thin film layer 22, a barrier layer 23, a well layer 24, a thin film layer 25, and a barrier layer 26. All the layers lying between the barrier layer 17 and the barrier layer 26 constitute a MQW 82. The nitride semiconductor device of the second embodiment differs from the nitride semiconductor device of the first embodiment in the temperature for formation of the thin film layer.

To be more specific, the nitride semiconductor device with the MQW structure in the second embodiment is fabricated by the following procedure using an MOCVD method. Note that the flow rates of gases supplied and the pressure within a reaction tube applied in the fabrication steps are set at the same values as those of the first embodiment.

First, the substrate 14 of sapphire having been adequately cleaned is inserted into the reaction tube of an MOCVD apparatus, and then with nitrogen and hydrogen flowed into the reaction tube, the substrate 14 is heated at about 1100° C. for ten minutes to clean the surface of the substrate 14.

Next, the temperature of the substrate 14 is lowered to about 570° C., and nitrogen, TMG, and ammonia are flowed into the reaction tube to form the buffer layer 15 of GaN on the substrate 14.

While TMG supply is stopped and nitrogen and ammonia are flowed, the temperature of the substrate 14 is elevated to about 1150° C. Under this temperature, nitrogen, hydrogen, TMG, and ammonia are flowed into the reaction tube to grow the underlying layer 16 of GaN on the buffer layer 15.

Subsequently, TMG supply is stopped, and then the temperature of the substrate 14 is lowered to about 1100° C. Under this temperature, nitrogen, hydrogen, TMG, TMA, and ammonia are flowed into the reaction tube to grow the 10 nm-thick barrier layer 17 of $Al_{0.15}Ga_{0.85}N$.

Supply of TMG, TMA, and hydrogen is stopped, and then the temperature of the substrate 14 is lowered to about 900° C. With the temperature of the substrate 14 at 900° C., nitrogen, TMG, TMA, TMI, and ammonia are flowed into the reaction tube to grow the 2 nm-thick well layer 18 of $Al_{0.02}In_{0.02}Ga_{0.96}N$.

Then, with the temperature of the substrate 14 kept at 900° C., supply of TMA and TMI is stopped, and nitrogen, TMG, and ammonia are flowed thereon to grow the thin film layer 19 of GaN on the well layer 18. Thereafter, supply of TMG is stopped, and the temperature of the substrate 14 is elevated to 1100° C.

With the temperature of the substrate 14 kept at 1100° C., nitrogen, hydrogen, TMG, TMA, and ammonia are flowed into the reaction tube to grow the 10 nm-thick barrier layer 20 of $Al_{0.15}Ga_{0.85}N$. Then, supply of TMG, TMA, and hydrogen is stopped and the temperature of the substrate 14 is lowered to 900° C.

Thereafter, the well layer 21, the thin film layer 22, the barrier layer 23, and other layers are sequentially stacked in the same procedure as formation of the well layer 18, the thin film layer 19, and the barrier layer 20. The MQW 82 is thus fabricated. By adjusting the amount of TMG supplied during elevation of temperature of the substrate 14, the thicknesses of the thin film layers 19, 22, and 25 made of GaN are controlled within the range of more than 0 nm and no more than 4 nm.

Figure 14:
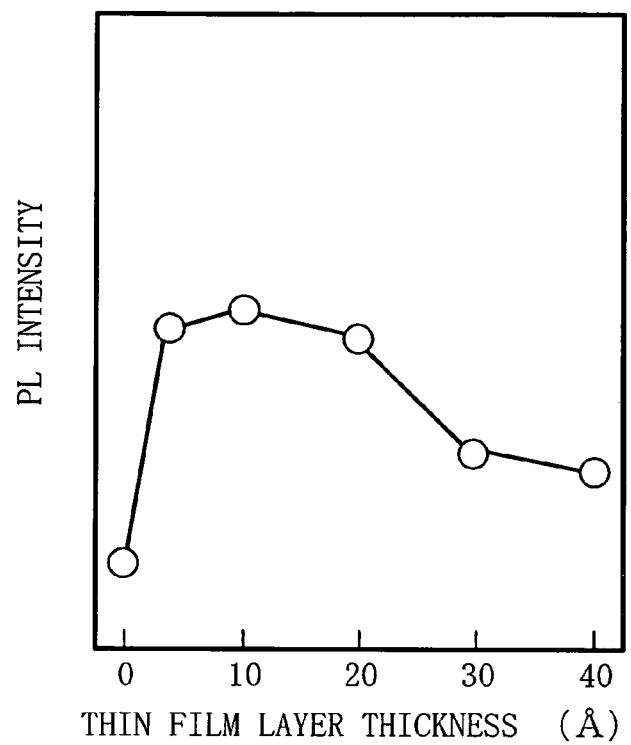
FIG. 14 is a graph showing the relation between the thickness of a thin film layer and the light emission intensity (PL intensity) in the MQW according to the second embodiment.

FIG. 14 is a graph showing the relation between the thickness of the thin film layer and the light emission intensity (PL intensity) in the MQW of the second embodiment. The number of nitride semiconductor layers stacked and the measurement condition are identical to those of the test in FIG. 12.

As can be seen from FIG. 14, the PL intensity of the MQW of the second embodiment significantly varied depending on the thickness of the thin film layer, and particularly the PL intensity was maximum when the thin film layer had a thickness of 2 nm or smaller. From this result, it is found that in the MQW of the second embodiment, it is particularly preferable to have the thin film layer with a thickness more than 0 nm and no more than 2 nm. However, for all of the measured thicknesses, the PL intensity of the MQW of the second embodiment greatly exceeded the PL intensity of the conventional MQW.

Figure 15:
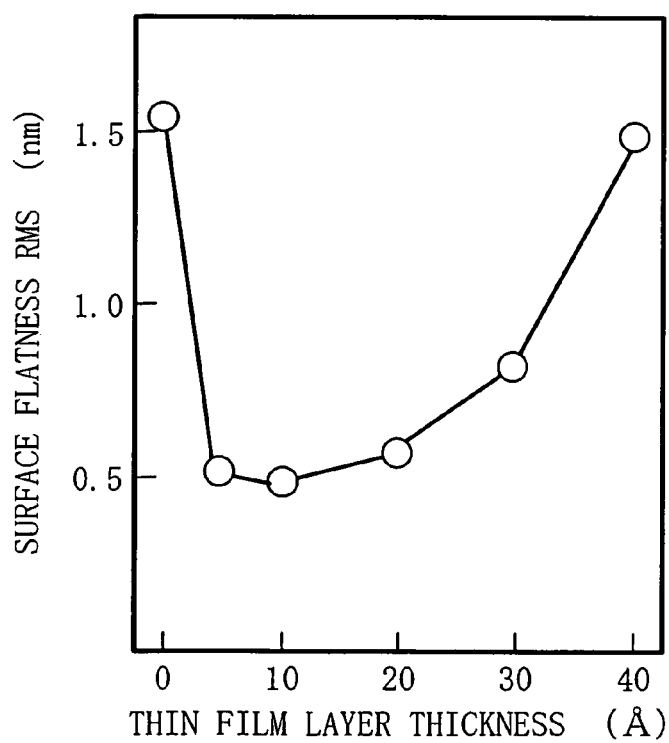
FIG. 15 is a graph showing the relation between the thickness of the thin film layer and the surface flatness in the MQW according to the second embodiment.

FIG. 15 is a graph showing the relation between the thickness of the thin film layer and the surface flatness in the MQW of the second embodiment. Also in this test, as in the case of the test in FIG. 14, the MQW has the structure in which three quantum wells are stacked.

From FIG. 15, it is found that the surface flatness of the MQW significantly varied depending on the thickness of the thin film layer, and in particular, when the thin film layer had a thickness of 2 nm or smaller, the RMS value of surface flatness (surface roughness) of the MQW became smaller. From this result, it is found that also in regard to the surface flatness, it is preferable to have the thin film layer with a thickness of 2 nm or smaller. However, for all of the measured thicknesses, the top surface of the MQW of the second embodiment was flatter than that of the conventional MQW.

From the results described above, it is found that even though the thin film layers 19, 22, and 25 are grown at the same temperature as those for the growth of the well layers 18, 21, and 24 like the second embodiment, the top surface of the well layer can be made flat to provide a more improved light emission intensity than the conventional MQW. This is conceivably because also the method for fabricating a MQW according to the second embodiment can prevent removal of nitrogen and the like from the well layer and can grow the well layer and the barrier layer at their optimal growth temperatures.

In addition, since the thin film layer has a band gap energy larger than that of the well layer and smaller than that of the barrier layer, almost the same level of carriers as the case of forming no thin film layer can be confined within the well layer.

Moreover, like the MQW of the first embodiment, in the MQW of the second embodiment, the formed thin film layer can also relax strain created between the well layer and the barrier layer as compared to the conventional MQW.

When comparison is made between FIG. 13 and FIG. 15, the MQW of the first embodiment has a flatter top surface. This is probably because the thin film layer of the MQW in the first embodiment can be formed at a temperature closer to the optimal growth temperature.

In the MQW of the second embodiment, $Al_{0.02}In_{0.02}Ga_{0.96}N$ that is a quaternary crystal is used as the material for the well layer, but the material for the well layer is not limited to this. As long as a mixed crystal containing In and Ga is used as the material for the well layer, the optimal growth temperature thereof is lower than that of a mixed crystal containing Al and Ga. Therefore, the same effects as the MQW of the second embodiment can be exerted. The barrier layer may also be made of a material other than AlGaN. For example, in the case where the thin film layer is made of GaN, even though the well layer is formed of InGaN (a ternary crystal) and the barrier layer is made of AlInGaN (a quaternary crystal), the same effects as the MQW of the second embodiment can be exerted. That is to say, it is sufficient that the well layer is made of $In_xAl_yGa_{1-x-y}N$ (0<x<1, 0<y<1, and 0<x+y<1) and the barrier layer is made of $In_wAl_zGa_{1-z-w}N$ (0≦w<1, 0<z<1, and 0<z+w<1). In the MQW of the second embodiment, GaN is used as the material for the thin film layer, but it is sufficient to use the material having an energy band gap larger than that of the well layer and smaller than that of the barrier layer.

Even if the barrier layer is undoped or n-doped, the MQW can exert the same effects. The example shown in FIG. 4 uses a sapphire substrate as the substrate 14, but use of another substrate such as a SiC substrate, a ZnO substrate, a GaN substrate, or a Si substrate can also provide the same effects as the MQW of the second embodiment.

Third Embodiment

Figure 6:
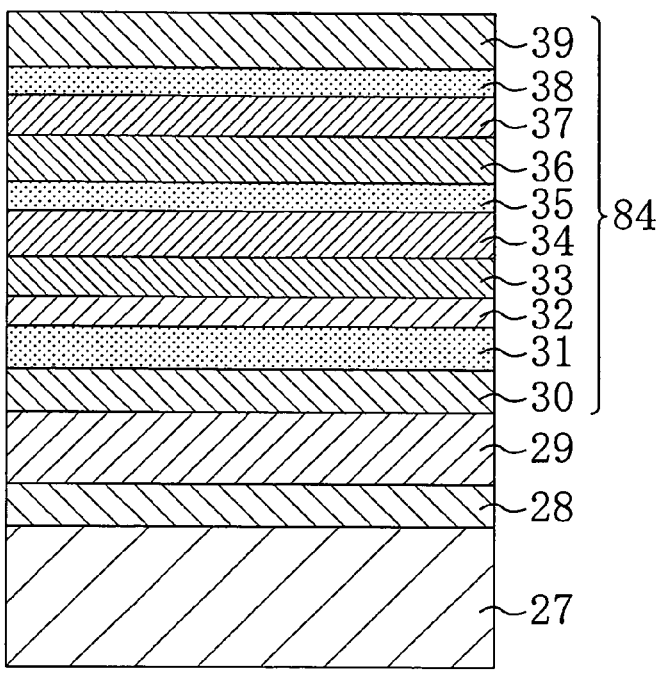
FIG. 6 is a sectional view showing a nitride semiconductor device with a MQW according to a third embodiment of the present invention.
Figure 7:
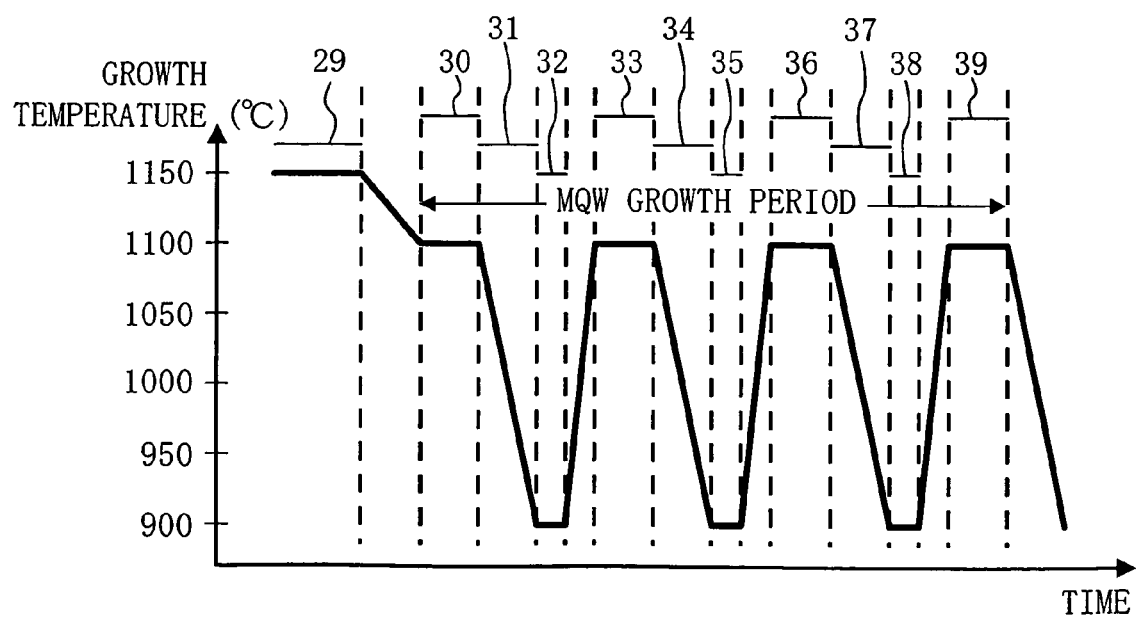
FIG. 7 is a graph showing a profile of the temperature for growing nitride semiconductor layers constituting the MQW according to the third embodiment.

FIG. 6 is a sectional view showing a nitride semiconductor device with a MQW according to a third embodiment of the present invention. FIG. 7 is a graph showing a profile of the temperature for growing nitride semiconductor layers constituting the MQW according to the third embodiment.

Referring to FIG. 6, the nitride semiconductor device of the third embodiment includes: a substrate 27 of sapphire; a buffer layer 28 of GaN provided on the substrate 27; an underlying layer 29 of GaN provided on the buffer layer 28; and a MQW 84 of nitride semiconductor provided on the underlying layer 29. The MQW 84 has a structure in which a barrier layer of $Al_{0.15}Ga_{0.85}N$, a thin film layer of GaN provided on the barrier layer, and a well layer of $Al_{0.02}In_{0.02}Ga_{0.96}N$ provided on the thin film layer are repeatedly stacked in this order. In the example shown in FIG. 6, on the underlying layer 29, a barrier layer 30, a thin film layer 31, a well layer 32, a barrier layer 33, a thin film layer 34, a well layer 35, a barrier layer 36, a thin film layer 37, a well layer 38, and a barrier layer 39 are sequentially provided from bottom to top. The thin film layers 31, 34, and 37 have a thickness of, for example, 4 nm or smaller, more preferably 2 nm or smaller. The well layers 32, 35, and 38 have a thickness of, for example, 2 nm. The barrier layers 30, 33, 36, and 39 have a thickness of, for example, 10 nm.

In the nitride semiconductor device of the third embodiment, the magnitudes of the band gap energies of the barrier layer, the thin film layer, and the well layer satisfy the barrier layer>the thin film layer>the well layer.

A characteristic of the MQW of the third embodiment is that the thin film layer of nitride semiconductor is provided on the barrier layer containing Al and Ga and under the well layer containing In and Ga.

The nitride semiconductor device with the MQW in the third embodiment is fabricated by the following procedure using an MOCVD method. Note that the flow rates of gases supplied and the pressure within a reaction tube applied in the fabrication steps are set at the same values as those of the first embodiment.

First, the substrate 27 of sapphire having been adequately cleaned is inserted into the reaction tube of an MOCVD apparatus, and then with nitrogen and hydrogen flowed into the reaction tube, the substrate 27 is heated at about 1100° C. for ten minutes to clean the surface of the substrate 27.

Next, the temperature of the substrate 27 is lowered to about 570° C., and nitrogen, TMG, and ammonia are flowed into the reaction tube to form the buffer layer 28 of GaN on the substrate 27.

While TMG supply is stopped and nitrogen and ammonia are flowed, the temperature of the substrate 27 is elevated to about 1150° C. Under this temperature, nitrogen, hydrogen, TMG, and ammonia are flowed into the reaction tube to grow the underlying layer 29 of GaN on the buffer layer 28.

Subsequently, TMG supply is stopped, and then the temperature of the substrate 27 is lowered to about 1100° C. Under this temperature, nitrogen, hydrogen, TMG, TMA, and ammonia are flowed into the reaction tube to grow the 10 nm-thick barrier layer 30 of $Al_{0.15}Ga_{0.85}N$.

Then, supply of TMA and hydrogen is stopped. While lowering the temperature of the substrate 27 to 900° C., nitrogen, TMG, and ammonia are flowed to grow the thin film layer 31 of GaN on the barrier layer 30.

When the temperature of the substrate 27 reaches 900° C., supply of TMG is stopped. With the substrate temperature kept at 900° C., nitrogen, TMG, TMA, TMI, and ammonia are flowed to grow the 2 nm-thick well layer 32 of $Al_{0.02}In_{0.02}Ga_{0.96}N$.

Thereafter, supply of TMG, TMA, and TMI is stopped, and the temperature of the substrate 27 is elevated from 900° C. to 1100° C.

With the temperature of the substrate 27 kept at 1100° C., nitrogen, hydrogen, TMG, TMA, and ammonia are flowed to grow the 10 nm-thick barrier layer 33 of $Al_{0.15}Ga_{0.85}N$.

Then, supply of TMA and hydrogen is stopped. While lowering the temperature of the substrate 27 to about 900° C., nitrogen, TMG, and ammonia are flowed to grow the thin film layer 34 of GaN. Thereafter, the well layer, the barrier layer, and the thin film layer are sequentially grown by repeatedly conducting the same procedure to fabricate the MQW. By adjusting the amount of TMG supplied during elevation of temperature of the substrate 27, the thicknesses of the thin film layers 31, 34, and 37 made of GaN are controlled within the range of more than 0 nm and no more than 4 nm.

Figure 16:
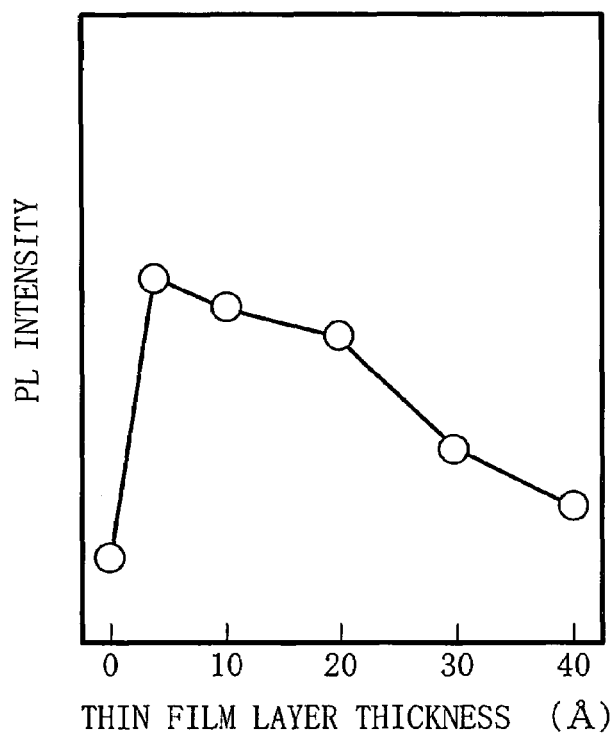
FIG. 16 is a graph showing the relation between the thickness of a thin film layer and the light emission intensity (PL intensity) in the MQW according to the third embodiment.

FIG. 16 is a graph showing the relation between the thickness of the thin film layer and the light emission intensity (PL intensity) in the MQW of the third embodiment. The number of nitride semiconductor layers stacked and the measurement condition are identical to those of the test in FIG. 12.

As can be seen from FIG. 16, the PL intensity of the MQW of the third embodiment significantly varied depending on the thickness of the thin film layer, and particularly the PL intensity was maximum when the thin film layer had a thickness of 2 nm or smaller. From this result, it is found that in the MQW of the third embodiment, it is particularly preferable to have the thin film layer with a thickness more than 0 nm and no more than 2 nm. However, for all of the measured thicknesses, the PL intensity of the MQW of the third embodiment exceeded the PL intensity of the conventional MQW.

Figure 17:
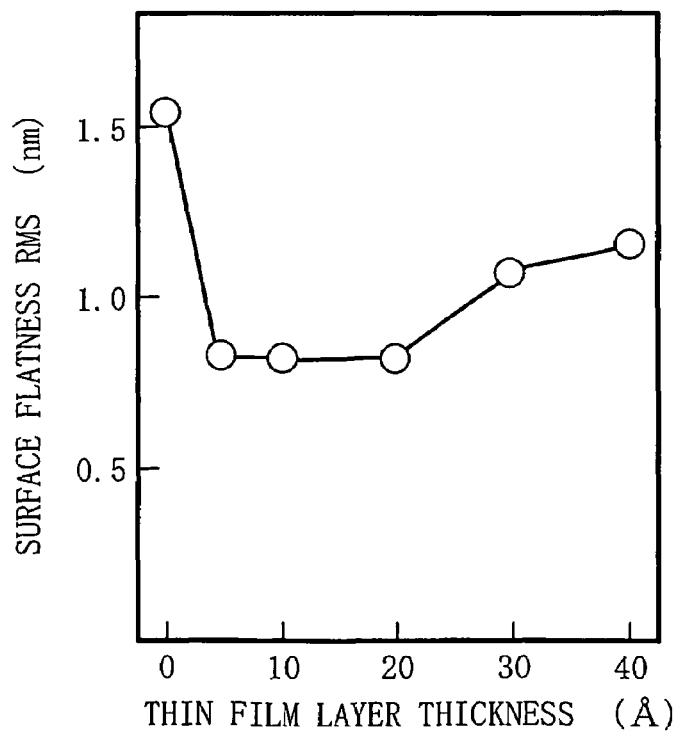
FIG. 17 is a graph showing the relation between the thickness of the thin film layer and the surface flatness in the MQW according to the third embodiment.

FIG. 17 is a graph showing the relation between the thickness of the thin film layer and the surface flatness in the MQW of the third embodiment. From the result shown in FIG. 17, it is found that the top surface flatness of the MQW significantly varied depending on the thickness of the thin film layer, and in particular, when the thin film layer had a thickness of 2 nm or smaller, the RMS value of surface flatness of the MQW became smaller. From this result, it is found that also in regard to the surface flatness, it is preferable to have the thin film layer with a thickness of 2 nm or smaller. However, for all of the measured thicknesses, the top surface of the MQW of the third embodiment was flatter than that of the conventional MQW.

From the results described above, it is found that even though the thin film layers 31, 34, and 37 are formed on the barrier layers 30, 33, and 36, respectively, like the third embodiment, the top surface of the MQW can be made flatter than that of the conventional MQW to provide a more improved light emission efficiency. This is conceivably because with the MQW of the third embodiment, removal of nitrogen from the barrier layer can be prevented to avoid degradation of the quality of the barrier layer and because the well layer and the barrier layer can be grown at their optimal growth temperatures. Moreover, with the MQW of the third embodiment, the change in the composition of the barrier layer can also be prevented.

Furthermore, like the MQW of the first and second embodiments, with the MQW of the third embodiment, the formed thin film layer can also relax strain created between the well layer and the barrier layer as compared to the conventional MQW. This also brings about improvement of the PL intensity. In addition, in the MQW of the third embodiment, since the thin film layer is formed during lowering of the temperature of the substrate 27, the period of time taken for formation of the thin film layer does not have to be prepared additionally. Therefore, formation of the MQW of the third embodiment can be done for the same period of time and at the same cost as the conventional MQW.

In the MQW of the third embodiment, $Al_{0.02}In_{0.02}Ga_{0.96}N$ that is a quaternary crystal is used as the material for the well layer, but the material for the well layer is not limited to this. As long as a mixed crystal containing In and Ga is used as the material for the well layer, the optimal growth temperature thereof is lower than that of a mixed crystal containing Al and Ga. Therefore, the same effects as the MQW of the third embodiment can be exerted. The barrier layer may also be made of a material other than AlGaN. For example, in the case where the thin film layer is made of GaN, even though the well layer is formed of InGaN (a ternary crystal) and the barrier layer is made of AlInGaN (a quaternary crystal), the same effects as the MQW of the third embodiment can be exerted. That is to say, it is sufficient that the well layer is made of $In_xAl_yGa_{1-x-y}N (0<x<1, 0<y<1, and 0<x+y<1)$ and the barrier layer is made of $In_wAl_zGa_{1-z-w}N (0 \leqq w<1, 0<z<1, and 0<z+w<1)$. In the MQW of the third embodiment, GaN is used as the material for the thin film layer, but it is sufficient to use the material having an energy band gap larger than that of the well layer and smaller than that of the barrier layer.

Even if the barrier layer is undoped or n-doped, the MQW can exert the same effects. The example shown in FIG. 6 uses a sapphire substrate as the substrate 27, but use of another substrate such as a SiC substrate, a ZnO substrate, a GaN substrate, or a Si substrate can also provide the same effects as the MQW of the third embodiment.

Fourth Embodiment

Figure 8:
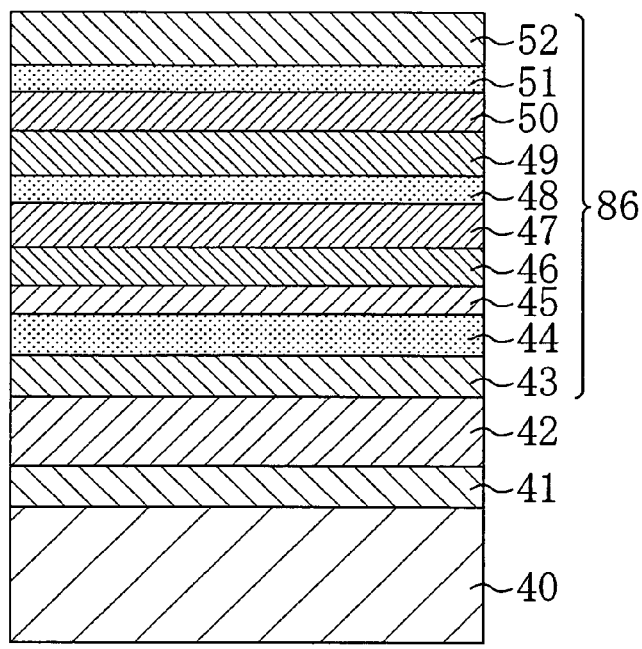
FIG. 8 is a sectional view showing a nitride semiconductor device with a MQW according to a fourth embodiment of the present invention.
Figure 9:
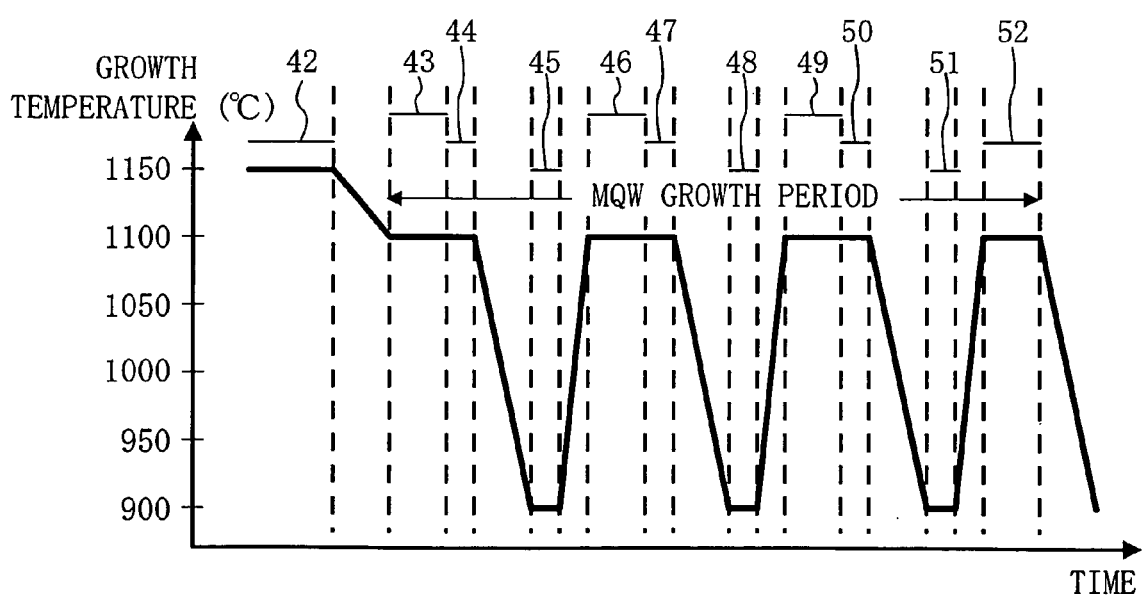
FIG. 9 is a graph showing a profile of the temperature for growing nitride semiconductor layers constituting the MQW according to the fourth embodiment.

FIG. 8 is a sectional view showing a nitride semiconductor device with a MQW according to a fourth embodiment of the present invention. FIG. 9 is a graph showing a profile of the temperature for growing nitride semiconductor layers constituting the MQW according to the fourth embodiment. The nitride semiconductor device of the fourth embodiment has the same structure as that of the nitride semiconductor device according to the third embodiment, but these embodiments differ in the temperature for formation of the thin film layer.

Specifically, the nitride semiconductor device of the fourth embodiment includes, from bottom to top, a substrate 40, a buffer layer 41, an underlying layer 42, a barrier layer 43, a thin film layer 44, a well layer 45, a barrier layer 46, a thin film layer 47, a well layer 48, a barrier layer 49, a thin film layer 50, a well layer 51, and a barrier layer 52. All the layers lying between the barrier layer 43 and the barrier layer 52 constitute a MQW 86.

The nitride semiconductor device with the MQW structure in the fourth embodiment is fabricated by the following procedure using an MOCVD method. Note that the flow rates of gases supplied and the pressure within a reaction tube applied in the fabrication steps are set at the same values as those of the first embodiment.

First, in the same procedure as those of the first to third embodiments, the buffer layer 41, the underlying layer 42, and the barrier layer 43 are sequentially formed on the substrate 40 of sapphire.

Next, as shown in FIG. 9, supply of TMA and hydrogen into the reaction tube is stopped. With the temperature of the substrate 40 kept at 1100° C., nitrogen, TMG, and ammonia are flowed to grow the thin film layer 44 of GaN on the barrier layer 43. As described above, growing the thin film layer 44 at the growth temperature of the barrier layer is a characteristic of the fabrication method according to the fourth embodiment.

Then, supply of TMG is stopped, and then the temperature of the substrate 40 is lowered to 900° C. When the temperature of the substrate 40 reaches 900° C., nitrogen, TMG, TMA, TMI, and ammonia are flowed into the reaction tube with the substrate temperature kept at 900° C., thereby growing the 2 nm-thick well layer 45 of $Al_{0.02}In_{0.02}Ga_{0.96}N$.

Thereafter, supply of TMG, TMA, and TMI is stopped, and the temperature of the substrate 40 is elevated from 900° C. to 1100° C. With the temperature of the substrate 40 kept at 1100° C., nitrogen, hydrogen, TMG, TMA, and ammonia are flowed into the reaction tube to grow the 10 nm-thick barrier layer 46 of $Al_{0.15}Ga_{0.85}N$.

Next, supply of TMA is stopped. With the temperature of the substrate 40 kept at 1100° C., nitrogen, TMG, and ammonia are flowed into the reaction tube to grow the thin film layer 47 of GaN.

The temperature of the substrate 40 is lowered to 900° C. When the temperature of the substrate 40 reaches 900° C., the substrate temperature is kept at that value and the well layer 48 is formed. Thereafter, the same procedure is repeated to fabricate the MQW. By adjusting the amount of TMG supplied during elevation of temperature of the substrate 40, the thicknesses of the thin film layers 44, 47, and 50 made of GaN are controlled within the range of more than 0 nm and no more than 4 nm.

Figure 18:
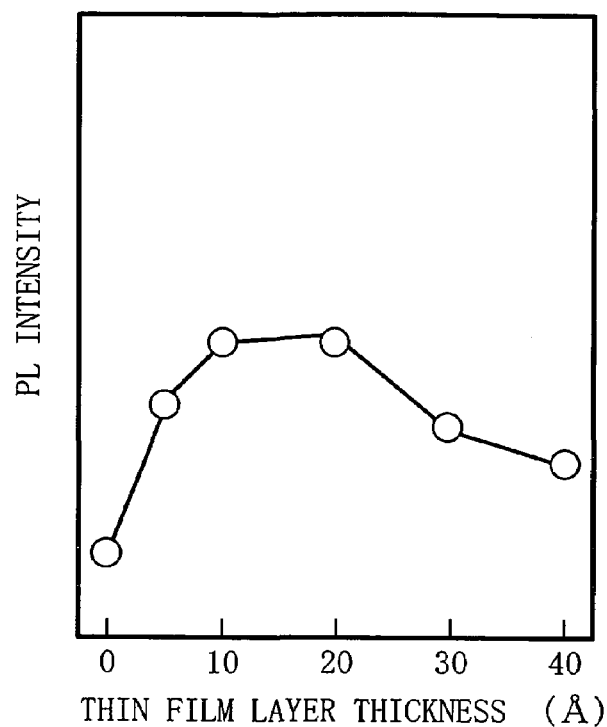
FIG. 18 is a graph showing the relation between the thickness of a thin film layer and the light emission intensity (PL intensity) in the MQW according to the fourth embodiment.

FIG. 18 is a graph showing the relation between the thickness of the thin film layer and the light emission intensity (PL intensity) in the MQW of the fourth embodiment. The number of nitride semiconductor layers stacked and the measurement condition are identical to those of the test in FIG. 12.

As can be seen from FIG. 18, the PL intensity of the MQW of the fourth embodiment significantly varied depending on the thickness of the thin film layer, and particularly the PL intensity was maximum when the thin film layer had a thickness of 2 nm or smaller. From this result, it is found that in the MQW of the fourth embodiment, it is particularly preferable to have the thin film layer with a thickness more than 0 nm and no more than 2 nm. However, for all of the measured thicknesses, the PL intensity of the MQW of the fourth embodiment greatly exceeded the PL intensity of the conventional MQW.

Figure 19:
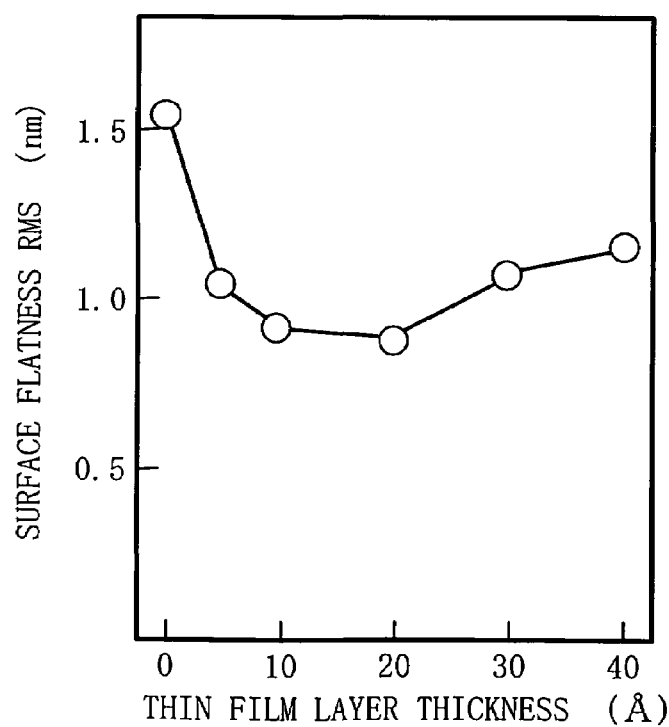
FIG. 19 is a graph showing the relation between the thickness of the thin film layer and the surface flatness in the MQW according to the fourth embodiment.

FIG. 19 is a graph showing the relation between the thickness of the thin film layer and the surface flatness in the MQW of the fourth embodiment.

From FIG. 19, it is found that the surface flatness of the MQW significantly varied depending on the thickness of the thin film layer, and in particular, when the thin film layer had a thickness of 2 nm or smaller, the RMS value of surface flatness (surface roughness) of the MQW became smaller. From this result, it is found that also in regard to the surface flatness, it is preferable to have the thin film layer with a thickness of 2 nm or smaller. However, for all of the measured thicknesses, the top surface of the MQW of the fourth embodiment was flatter than that of the conventional MQW. This is conceivably because with the MQW of the fourth embodiment, removal of nitrogen from the barrier layer can be prevented to avoid degradation of the quality of the barrier layer and because the well layer and the barrier layer can be grown at their optimal growth temperatures. Moreover, with the MQW of the fourth embodiment, the change in the composition of the barrier layer can also be prevented.

Moreover, in the MQW of the fourth embodiment, since the thin film layer is formed between the well layer and the barrier layer, strain created between the layers can be relaxed as compared to the conventional MQW. This also brings about improvement of the PL intensity.

In the MQW of the fourth embodiment, $Al_{0.02}In_{0.02}Ga_{0.96}N$ that is a quaternary crystal is used as the material for the well layer, but the material for the well layer is not limited to this. As long as a mixed crystal containing In and Ga is used as the material for the well layer, the optimal growth temperature thereof is lower than that of a mixed crystal containing Al and Ga. Therefore, the same effects as the MQW of the fourth embodiment can be exerted. The barrier layer may also be made of a material other than AlGaN. For example, in the case where the thin film layer is made of GaN, even though the well layer is formed of InGaN (a ternary crystal) and the barrier layer is made of AlInGaN (a quaternary crystal), the same effects as the MQW of the fourth embodiment can be exerted. That is to say, it is sufficient that the well layer is made of $In_xAl_yGa_{1-x-y}N$ ($0<x<1$, $0<y<1$, and $0<x+y<1$) and the barrier layer is made of $In_wAl_zGa_{1-z-w}N$ ($0 \leq w<1$, $0<z<1$, and $0<z+w<1$). In the MQW of the fourth embodiment, GaN is used as the material for the thin film layer, but it is sufficient to use the material having an energy band gap larger than that of the well layer and smaller than that of the barrier layer.

Even if the barrier layer is undoped or n-doped, the MQW can exert the same effects. The example shown in FIG. 8 uses a sapphire substrate as the substrate 40, but use of another substrate such as a SiC substrate, a ZnO substrate, a GaN substrate, or a Si substrate can also provide the same effects as the MQW of the fourth embodiment.

Fifth Embodiment

Figure 10:
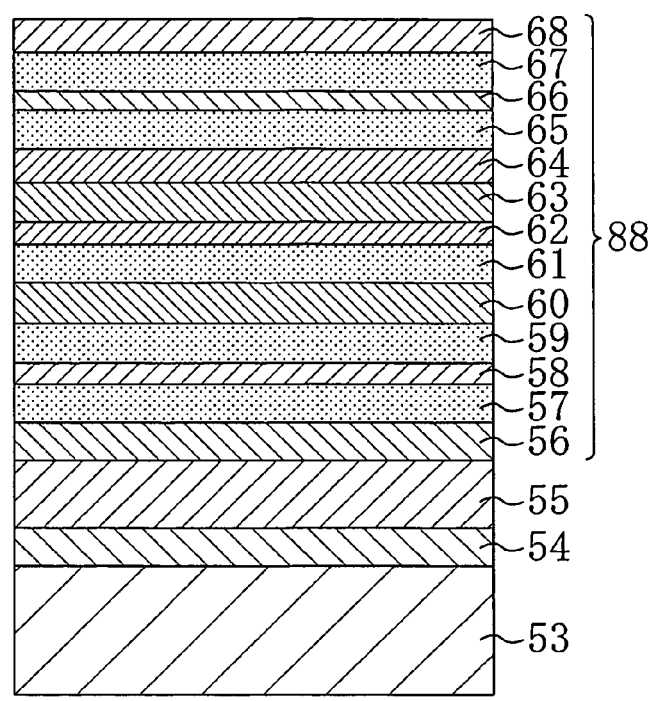
FIG. 10 is a sectional view showing a nitride semiconductor device with a MQW according to a fifth embodiment of the present invention.
Figure 11:
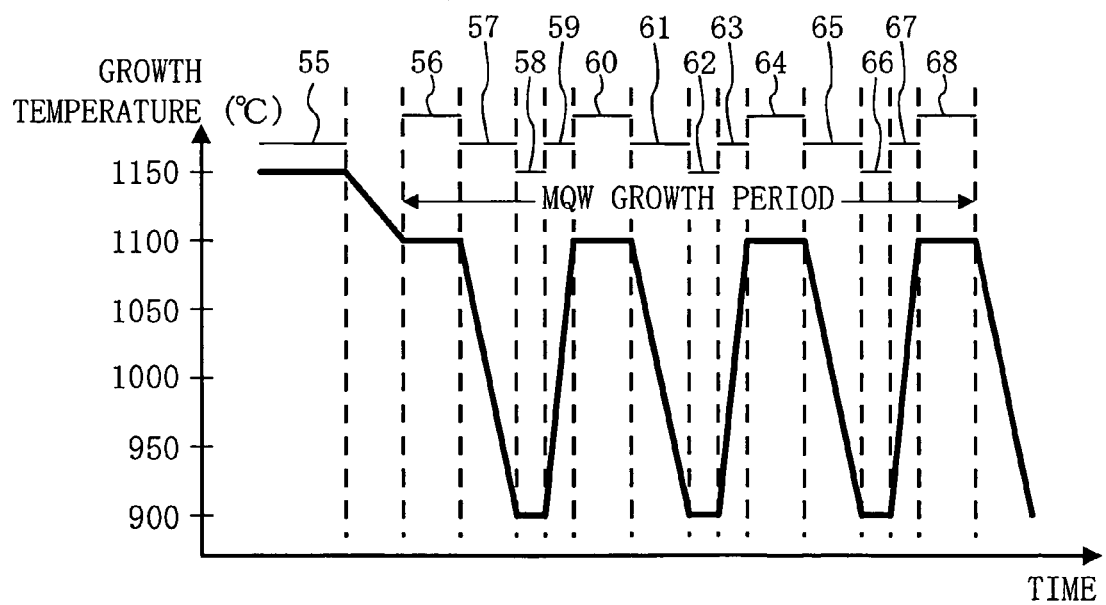
FIG. 11 is a graph showing a profile of the temperature for growing nitride semiconductor layers constituting the MQW according to the fifth embodiment.

FIG. 10 is a sectional view showing a nitride semiconductor device with a MQW according to a fifth embodiment of the present invention. FIG. 11 is a graph showing a profile of the temperature for growing nitride semiconductor layers constituting the MQW according to the fifth embodiment.

Referring to FIG. 10, the nitride semiconductor device of the fifth embodiment includes: a substrate 53 of sapphire; a buffer layer 54 of GaN provided on the substrate 53; an underlying layer 55 of GaN provided on the buffer layer 54; and a MQW 88 of nitride semiconductor provided on the underlying layer 55. The MQW 88 has a structure in which a barrier layer of $Al_{0.15}Ga_{0.85}N$, a first thin film layer of GaN provided on the barrier layer, a well layer of $Al_{0.02}In_{0.02}Ga_{0.96}N$ provided on the first thin film layer, and a second thin film layer of GaN provided on the well layer are repeatedly stacked in this order. In this structure, the uppermost layer is the barrier layer.

In the example shown in FIG. 10, on the underlying layer 55, a barrier layer 56, a first thin film layer 57, a well layer 58, a second thin film layer 59, a barrier layer 60, a first thin film layer 61, a well layer 62, a second thin film layer 63, a barrier layer 64, a first thin film layer 65, a well layer 66, a second thin film layer 67, and a barrier layer 68 are sequentially provided from bottom to top. The first thin film layers 57, 61, and 65 and the second thin film layers 59, 63, and 67 have a thickness of, for example, 4 nm or smaller, more preferably 2 nm or smaller. The well layers 58, 62, and 66 have a thickness of, for example, 2 nm. The barrier layers 56, 60, 64, and 68 have a thickness of, for example, 10 nm.

In the nitride semiconductor device of the fifth embodiment, the magnitudes of the band gap energies of the barrier layer, the thin film layer, and the well layer satisfy the barrier layer>the first thin film layer=the second thin film layer>the well layer.

A characteristic of the MQW of the fifth embodiment is that the first thin film layer of nitride semiconductor is provided under the well layer containing In and Ga and that the second thin film layer of nitride semiconductor is provided on the well layer.

The nitride semiconductor device with the MQW in the fifth embodiment is fabricated by the following procedure using an MOCVD method. Note that the flow rates of gases supplied and the pressure within a reaction tube applied in the fabrication steps are set at the same values as those of the first embodiment.

First, by the same procedure as those of the first to fourth embodiments, the buffer layer 54, the underlying layer 55, and the barrier layer 56 are sequentially formed on the substrate 53 of sapphire.

Then, supply of TMA and hydrogen is stopped. While lowering the temperature of the substrate 53 from about 1100° C. to about 900° C., nitrogen, TMG and ammonia are flowed to grow the first thin film layer 57 of GaN.

Then, when the temperature of the substrate 53 reaches 900° C., supply of TMG is stopped. With the substrate temperature kept at 900° C., nitrogen, TMG, TMA, TMI, and ammonia are flowed to grow the 2 nm-thick well layer 58 of $Al_{0.02}In_{0.02}Ga_{0.96}N$.

Thereafter, supply of TMA and TMI is stopped. While elevating the temperature of the substrate 53 from 900° C. to 1100° C., nitrogen, TMG, and ammonia are flowed to grow the second thin film layer 59 of GaN.

After the temperature of the substrate 53 reaches 1100° C., supply of TMG is stopped. With the temperature of the substrate 53 kept at 1100° C., nitrogen, hydrogen, TMG, TMA, and ammonia are flowed into the reaction tube to grow the 10 nm-thick barrier layer 60 of $Al_{0.15}Ga_{0.85}N$.

Then, supply of TMG, TMA, and hydrogen is stopped. While lowering the temperature of the substrate 53 to about 900° C., nitrogen, TMG, and ammonia are flowed to grow the first thin film layer 61 of GaN. Hereafter, the same procedure is repeatedly conducted to fabricate the MQW.

By adjusting the amount of TMG supplied during elevation of temperature of the substrate 53, the thicknesses of the first thin film layers 57, 61, and 65 and the second thin film layers 59, 63, and 67 made of GaN are controlled within the range of more than 0 nm and no more than 4 nm.

Figure 20:
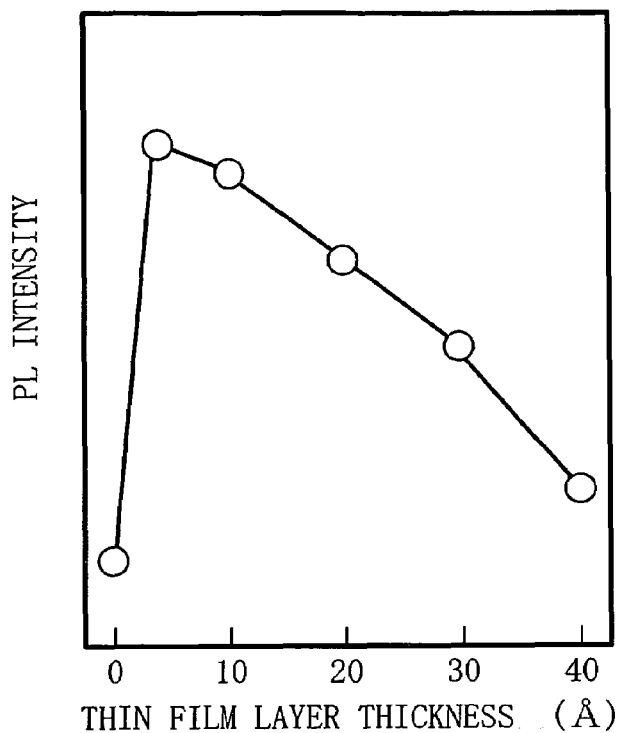
FIG. 20 is a graph showing the relation between the thickness of a thin film layer and the light emission intensity (PL intensity) in the MQW according to the fifth embodiment.

FIG. 20 is a graph showing the relation between the thickness of the thin film layer and the light emission intensity (PL intensity) in the MQW of the fifth embodiment. The number of nitride semiconductor layers stacked and the measurement condition are identical to those of the test in FIG. 12.

As can be seen from FIG. 20, the PL intensity of the MQW of the fifth embodiment significantly varied depending on the thickness of the thin film layer, and particularly the PL intensity was maximum when the thin film layer had a thickness of 2 nm or smaller. From this result, it is found that in the MQW of the fifth embodiment, it is particularly preferable to have the thin film layer with a thickness more than 0 nm and no more than 2 nm, more preferably, no more than 1 nm. However, for all of the measured thicknesses, the PL intensity of the MQW of the fifth embodiment greatly exceeded the PL intensity of the conventional MQW.

Figure 21:
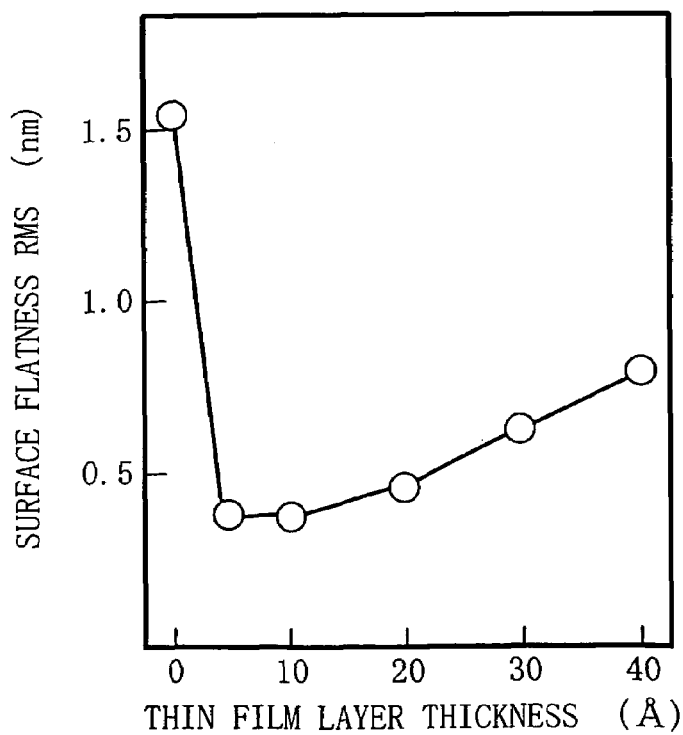
FIG. 21 is a graph showing the relation between the thickness of the thin film layer and the surface flatness in the MQW according to the fifth embodiment.

FIG. 21 is a graph showing the relation between the thickness of the thin film layer and the surface flatness in the MQW of the fifth embodiment.

From the result shown in FIG. 21, it is found that the surface flatness of the MQW significantly varied depending on the thickness of the thin film layer, and in particular, when the thin film layer had a thickness of 2 nm or smaller, the RMS value of surface flatness (surface roughness) of the MQW became smaller. From this result, it is found that also in regard to the surface flatness, it is preferable to have the thin film layer with a thickness of 2 nm or smaller. However, for all of the measured thicknesses, the top surface of the MQW of the fifth embodiment was flatter than that of the conventional MQW. Not only that, the top surface of the MQW of the fifth embodiment was flatter than those of the first to fourth embodiments. This is conceivably because the first thin film layer prevents removal of nitrogen and the like from the barrier layer and concurrently the second thin film layer prevents removal of nitrogen from the well layer. Thereby, the MQW of the fifth embodiment prevents degradation of the qualities of the barrier layer and the well layer to provide a very high light emission efficiency. Moreover, in the MQW of the fifth embodiment, by forming the thin film layer, the first and second thin film layers are provided between the well layer and the respective barrier layers. Therefore, strain placed to the well layer by both the above and below layers is reduced. This also brings about improvement of the PL intensity.

In the MQW of the fifth embodiment, $Al_{0.02}In_{0.02}Ga_{0.96}N$ that is a quaternary crystal is used as the material for the well layer, but the material for the well layer is not limited to this. As long as a mixed crystal containing In and Ga is used as the material for the well layer, the optimal growth temperature thereof is lower than that of a mixed crystal containing Al and Ga. Therefore, the same effects as the MQW of the fifth embodiment can be exerted. The barrier layer may also be made of a material other than AlGaN. For example, in the case where the first and second thin film layers are made of GaN, even though the well layer is formed of InGaN (a ternary crystal) and the barrier layer is made of AlInGaN (a quaternary crystal), the same effects as the MQW of the fifth embodiment can be exerted. That is to say, it is sufficient that the well layer is made of $In_xAl_yGa_{1-x-y}N$ (0<x<1, 0<y<1, and 0<x+y<1) and the barrier layer is made of $In_wAl_zGa_{1-z-w}N$ (0≦w<1, 0<z<1, and 0<z+w<1). In the MQW of the fifth embodiment, GaN is used as the materials for the first and second thin film layers, but it is sufficient to use the material having an energy band gap larger than that of the well layer and smaller than that of the barrier layer.

Even if the barrier layer is undoped or n-doped, the MQW can exert the same effects. The example shown in FIG. 10 uses a sapphire substrate as the substrate 53, but use of another substrate such as a SiC substrate, a ZnO substrate, a GaN substrate, or a Si substrate can also provide the same effects as the MQW of the fifth embodiment.

INDUSTRIAL APPLICABILITY

As described above, the present invention is useful for producing a high-quality multiple quantum well structure with little crystal degradation, and thereby can be employed for various semiconductor devices such as light emitting elements.

What is claimed is:

1. A method for fabricating a nitride semiconductor device which includes a well layer provided above a substrate, a plurality of barrier layers sandwiching the well layer to construct a quantum well, and a first thin film layer provided on one of the plurality of barrier layers and under the well layer, the method comprising:

the step (a) of depositing nitride semiconductor containing Al and Ga above the substrate at a substrate temperature T1, thereby forming one of the plurality of barrier layers;

the step (b) of depositing, on one said barrier layer, nitride semiconductor having a smaller band gap energy than one said barrier layer, thereby forming the first thin film layer;

the step (c) of depositing nitride semiconductor on the first thin film layer at a substrate temperature T2 (where T1>T2) to form the well layer, the nitride semiconductor containing In and Ga and having a smaller band gap energy than the first thin film layer; and the step (d) of depositing nitride semiconductor on or above the well layer at a substrate temperature T3 (where T3>T2) to form another one of the plurality of barrier layers, the nitride semiconductor containing Al and Ga and having a larger band gap energy than the first thin film layer and the well layer, wherein the T1 and T3 are higher than a substrate temperature of the step (b).

2. The method of claim 1, wherein the nitride semiconductor device further comprises a second thin film layer provided on the well layer and under another one of the plurality of barrier layers, and the method further comprises, after the step (c) and before the step (d), the step (e) of depositing nitride semiconductor on the well layer to form the second thin film layer, the nitride semiconductor having a band gap energy larger than that of the well layer and smaller than those of the plurality of barrier layers.

3. A method for fabricating a nitride semiconductor device which includes a well layer provided above a substrate, a plurality of barrier layers sandwiching the well layer to construct a quantum well, and a first thin film layer provided on one of the plurality of barrier layers and under the well layer, the method comprising:

the step (a) of depositing nitride semiconductor containing Al and Ga above the substrate at a substrate temperature T1, thereby forming one of the plurality of barrier layers;

the step (b) of depositing, on one said barrier layer, nitride semiconductor having a smaller band gap energy than one said barrier layer, thereby forming the first thin film layer;

the step (c) of depositing nitride semiconductor on the first thin film layer at a substrate temperature T2 (where T1>T2) to form the well layer, the nitride semiconductor containing In and Ga and having a smaller band gap energy than the first thin film layer; and the step (d) of depositing nitride semiconductor on or above the well layer at a substrate temperature T3 (where T3>T2) to form another one of the plurality of barrier layers, the nitride semiconductor containing Al and Ga and having a larger band gap energy than the first thin film layer and the well layer, wherein in the step (b), the first thin film layer is formed with the substrate temperature kept at T1.

4. A method for fabricating a nitride semiconductor device which includes a well layer provided above a substrate, a plurality of barrier layers sandwiching the well layer to construct a quantum well, and a first thin film layer provided on one of the plurality of barrier layers and under the well layer, the method comprising:

the step (a) of depositing nitride semiconductor containing Al and Ga above the substrate at a substrate temperature T1, thereby forming one of the plurality of barrier layers;

the step (b) of depositing, on one said barrier layer, nitride semiconductor having a smaller band gap energy than one said barrier layer, thereby forming the first thin film layer;

the step (c) of depositing nitride semiconductor on the first thin film layer at a substrate temperature T2 (where T1>T2) to form the well layer, the nitride semiconductor containing In and Ga and having a smaller band gap energy than the first thin film layer; and the step (d) of depositing nitride semiconductor on or above the well layer at a substrate temperature T3 (where T3>T2) to form another one of the plurality of barrier layers, the nitride semiconductor containing Al and Ga and having a larger band gap energy than the first thin film layer and the well layer, wherein in the step (b), the first thin film layer is formed while lowering the substrate temperature from T1 to T2.

5. A method for fabricating a nitride semiconductor device which includes a well layer provided above a substrate, a plurality of barrier layers sandwiching the well layer to construct a quantum well, and a first thin film layer provided on one of the plurality of barrier layers and under the well layer, the method comprising:

the step (a) of depositing nitride semiconductor containing Al and Ga above the substrate at a substrate temperature T1, thereby forming one of the plurality of barrier layers;

the step (b) of depositing, on one said barrier layer, nitride semiconductor having a smaller band gap energy than one said barrier layer, thereby forming the first thin film layer;

the step (c) of depositing nitride semiconductor on the first thin film layer at a substrate temperature T2 (where T1>T2) to form the well layer, the nitride semiconductor containing In and Ga and having a smaller band gap energy than the first thin film layer; and the step (d) of depositing nitride semiconductor on or above the well layer at a substrate temperature T3 (where T3>T2) to form another one of the plurality of barrier layers, the nitride semiconductor containing Al and Ga and having a larger band gap energy than the first thin film layer and the well layer, wherein the nitride semiconductor device further comprises a second thin film layer provided on the well layer and under another one of the plurality of barrier layers, the method further comprises, after the step (c) and before the step (d), the step (e) of depositing nitride semiconductor on the well layer to form the second thin film layer, the nitride semiconductor having a band gap energy larger than that of the well layer and smaller than those of the plurality of barrier layers, and in the step (e), the second thin film layer is formed while elevating the substrate temperature from T2 to T3.

6. A method for fabricating a nitride semiconductor device which includes a well layer provided above a substrate, a plurality of barrier layers sandwiching the well layer to construct a quantum well, and a thin film layer provided on the well layer and under one of the plurality of barrier layers, the method comprising:

the step (a) of depositing nitride semiconductor containing Al and Ga above the substrate at a substrate temperature T1, thereby forming one of the plurality of barrier layers;

the step (b) of depositing nitride semiconductor on or above one said barrier layer at a substrate temperature T2 (where T1>T2) to form the well layer, the nitride semiconductor containing In and Ga and having a smaller band gap energy than one said barrier layer;

the step (c) of depositing nitride semiconductor directly on the well layer to form the thin film layer, the nitride semiconductor having a band gap energy larger than that of the well layer and smaller than those of the plurality of barrier layers; and the step (d) of depositing nitride semiconductor directly on the thin film layer at a substrate temperature T3 (where T3>T2) to form another one of the plurality of barrier layers, the nitride semiconductor containing Al and Ga and having a larger band gap energy than the thin film layer and the well layer.

7. A method for fabricating a nitride semiconductor device which includes a well layer provided above a substrate, a plurality of barrier layers sandwiching the well layer to construct a quantum well, and a thin film layer provided on the well layer and under one of the plurality of barrier layers, the method comprising:

the step (a) of depositing nitride semiconductor containing Al and Ga above the substrate at a substrate temperature T1, thereby forming one of the plurality of barrier layers;

the step (b) of depositing nitride semiconductor on or above one said barrier layer at a substrate temperature T2 (where T1>T2) to form the well layer, the nitride semiconductor containing In and Ga and having a smaller band gap energy than one said barrier layer;

the step (c) of depositing nitride semiconductor on the well layer to form the thin film layer, the nitride semiconductor having a band gap energy larger than that of the well layer and smaller than those of the plurality of barrier layers; and the step (d) of depositing nitride semiconductor on the thin film layer at a substrate temperature T3 (where T3>T2) to form another one of the plurality of barrier layers, the nitride semiconductor containing Al and Ga and having a larger band gap energy than the thin film layer and the well layer, wherein in the step (c), the thin film layer is formed with the substrate temperature kept at T2.

8. A method for fabricating a nitride semiconductor device which includes a well layer provided above a substrate, a plurality of barrier layers sandwiching the well layer to construct a quantum well, and a thin film layer provided on the well layer and under one of the plurality of barrier layers, the method comprising:

the step (a) of depositing nitride semiconductor containing Al and Ga above the substrate at a substrate temperature T1, thereby forming one of the plurality of barrier layers;

the step (b) of depositing nitride semiconductor on or above one said barrier layer at a substrate temperature T2 (where T1>T2) to form the well layer, the nitride semiconductor containing In and Ga and having a smaller band gap energy than one said barrier layer;

the step (c) of depositing nitride semiconductor on the well layer to form the thin film layer, the nitride semiconductor having a band gap energy larger than that of the well layer and smaller than those of the plurality of barrier layers; and the step (d) of depositing nitride semiconductor on the thin film layer at a substrate temperature T3 (where T3>T2) to form another one of the plurality of barrier layers, the nitride semiconductor containing Al and Ga and having a larger band gap energy than the thin film layer and the well layer, wherein in the step (c), the thin film layer is formed while elevating the substrate temperature from T2 to T3.

\* \* \* \* \*